United States Patent

Grosvenor et al.

Patent Number: 5,800,946
Date of Patent: Sep. 1, 1998

[54] BIPOLAR LEAD-ACID BATTERY PLATES

[76] Inventors: Victor L. Grosvenor, 21875 Canon Dr., Topanga, Calif. 90290; Naum Pinsky, 1627 Michael La., Pacific Palisades, Calif. 90272

[21] Appl. No.: 761,781

[22] Filed: Dec. 6, 1996

[51] Int. Cl.$^6$ ............................................. H01M 10/18
[52] U.S. Cl. ........................ 429/210; 429/234; 429/244
[58] Field of Search ............................ 429/210, 209, 429/241, 243, 244, 234

[56] References Cited

U.S. PATENT DOCUMENTS

| | | | |
|---|---|---|---|
| 4,161,569 | 7/1979 | Faber | 429/234 |
| 4,275,130 | 6/1981 | Rippel et al. | 429/210 X |
| 4,683,648 | 8/1987 | Yeh et al. | |
| 4,708,918 | 11/1987 | Fitzgerald et al. | 429/210 |
| 4,749,635 | 6/1988 | Muller et al. | 429/241 X |
| 4,892,797 | 1/1990 | Rao et al. | 429/210 |
| 4,900,643 | 2/1990 | Eskra et al. | |
| 4,960,655 | 10/1990 | Hope et al. | 429/209 X |
| 5,068,160 | 11/1991 | Clough et al. | |
| 5,288,566 | 2/1994 | Ginatta et al. | |
| 5,334,464 | 8/1994 | Rowlette | 429/210 |
| 5,348,817 | 9/1994 | Rao et al. | 429/210 |
| 5,379,502 | 1/1995 | Feldstein | |
| 5,643,696 | 7/1997 | Rowlette | 429/210 |

FOREIGN PATENT DOCUMENTS

| | | | |
|---|---|---|---|
| 585703 | 2/1947 | United Kingdom | 429/210 |
| 1339519 | 12/1973 | United Kingdom | 429/210 |

*Primary Examiner*—Anthony Skapars
*Attorney, Agent, or Firm*—Frank J. Uxa

[57] ABSTRACT

Electrodes, particularly useful in bipolar plates of lead-acid batteries, include a metal-containing substrate, an electrically conductive material secured to the first side of the substrate, an electrically conductive layer including a polymer secured to the second side of the substrate; and a metallic layer secured to the electrically conductive layer so that the electrically conductive layer is located between the metallic layer and the substrate. Bipolar plates are provided and include an electrically conductive electrode element, a grid spaced apart from the electrode in proximity to the first side of the electrode element, positive active material in contact with the first side or second side of the electrode element and negative active material in contact with the first side or second side of the electrode element which is not in contact with the positive active material.

7 Claims, 2 Drawing Sheets

BIPOLAR LEAD-ACID BATTERY PLATES

FIELD OF THE INVENTION

The present invention relates to the field of rechargeable storage batteries, more particularly to electrodes and bipolar plate structures to be used in bipolar lead-acid batteries and methods of fabricating the same.

BACKGROUND OF THE INVENTION

Lead-acid secondary batteries have been employed for some time for a variety of applications requiring general purpose electrochemical storage. The advantages of lead-acid batteries include: low cost of manufacture, simplicity of design, reliability and relative safety when compared to other electrochemical systems. Relatively good specific power has enabled the widespread use of lead-acid batteries for starting, lighting and ignition (SLI) purposes for vehicular, e.g., automotive, marine and aviation, applications. The lead-acid system has also found widespread use as traction batteries such as, for example, in golf carts and boats. However, the widespread use of lead-acid batteries for electric cars as an alternative to fossil fuel transportation has been limited by the need for better specific energy and deep discharge cycle lifetime. Bipolar lead-acid batteries have shown increasing promise at overcoming these limitations.

Conventional lead-acid batteries usually consist of individual positive and negative lead grids pasted respectively with positive active material (PAM) and negative active material (NAM). The lead grids must be thick enough so that they are structurally strong enough to support the active material, for example, lead-based paste. The extensive use of lead for the lead grids also limits the specific energy of the battery. In addition, continuous deep discharge cycling causes a corrosion layer to form on the positive lead grid resulting in poor contact of the active material with the lead grids which, in turn, leads to loss of power and to lower deep discharge cycle life.

In a typical bipolar lead-acid battery design, each electrode includes an electrically conductive and electrolyte impervious sheet or plate which serves as a partition between the battery cells. The PAM is adhered to the positive side and NAM is adhered to the opposite, negative side. The bipolar electrodes are stacked parallel to and on top of each other with the positive side of each electrode facing the negative side of the adjacent electrode. The current is collected perpendicular to the plane of the thin plates at endplates terminating at both ends of the stack of bipolar plates. This arrangement allows for the possibility of batteries with lower internal resistance and, thus, higher specific power. With the bipolar battery design it is possible to choose lightweight conductive materials to construct bipolar electrodes that do not corrode under continuous deep discharge cycling. Despite the apparent advantages of bipolar lead-acid batteries, the substantial effort to develop these batteries has yet to yield a commercially viable product.

Several materials have been used for various bipolar plate designs to meet the critical demands placed on it within the lead-acid battery environment. A practical bipolar plate should offer: the structural integrity to support the active material yet be lightweight; resistance to the various corrosion mechanisms occurring on both the positive and negative sides of the bipolar electrode during cycling; and the ability to be inexpensively manufactured. Corrosion may render the surface of the bipolar plate non-conductive or it may result in the bipolar plate being perforated thus causing an electrical short between two adjacent cells and battery failure.

A bipolar battery plate consisting of a plastic or polymer-based composite made of electrically conductive fibers or particles embedded in a polymer matrix is disclosed by Fitzgerald et al U.S. Pat. No. 4,708,918. The fibers are composed of acid resistant glass coated with fluorine doped tin dioxide which are resistant to corrosive potentials on the positive side. This patent discloses a thin film or foil of lead adhered to the polymer-based (resin) layer by a graphite-filled epoxy polymer adhesive. Although the polymer-based composite reduces the need for corrosion protection, it also has somewhat limited conductivity properties.

Rippel et al in U.S. Pat. No. 4,275,130 discloses a polymer-based composite bipolar battery plate using carbon fibers or particles as the filler for electrical conductivity. The carbon fibers, while stable to the potentials on the negative side, quickly oxidize at the potentials on the positive side causing perforation of the plate, resulting in battery failure.

Bipolar battery plates based on metallic sheets inherently offer the possibility of better electrical conductivity and strength than their polymer-based composite counterparts. The earliest bipolar plates were constructed of a lead sheet which were unsuitable because of lead corrosion on the positive side and excessive weight.

Rao et al in U.S. Pat. No. 4,892,797 discloses a bipolar plate structure in which an intermediate double sided electrically conductive pressure sensitive adhesive film is laminated between electropositive and electronegative layers, both of which may be metal sheets. Rao et al does not suggest that this intermediate layer has corrosion protective properties.

Rao et al in U.S. Pat. No. 5,348,817 discloses a bipolar battery plate having a multilayered metallic substrate structured as C/A/B/D where the surfaces of C and D are the positive and negative sides, respectively. Layer C consists of a layer of lead or lead alloy, and/or conductive oxides of tin, titanium or ruthenium. Layer A consists of a layer of titanium or tin. Layer B consists of a layer of copper or tin. Layer D consists of a layer of lead or lead alloy or tin.

A particular embodiment of a bipolar battery plate, disclosed by Rowlette U.S. Pat. No. 5,334,464, includes a core sheet of titanium protected on the positive side from corrosion by a protective layer of fluorine doped tin dioxide and protected on the negative side by a layer of lead or carbon.

In both Rao et al U.S. Pat. No. 5,348,817 and Rowlette U.S. Pat. No. 5,334,464, a core metallic layer is disclosed which is protected from corrosive potentials by additional layers that are resistant to corrosion. If titanium is used as the central core substrate, additional protective layer(s) must be added to the positive and negative sides that are resistant to corrosive potentials on the positive or negative sides. These protective layers must be thick enough to be free of pinholes and defects which may expose the titanium layer to corrosive potentials. In the case where the protective layers are metals, thicker layers result in substantial weight being disadvantageously added to the bipolar plate.

The active material often undergoes change in volume, for example, of about 20%, during a typical charge/discharge cycle. If the active material becomes separated and loses electrical contact with the bipolar electrode, loss of power results. In the conventional monopolar lead-acid battery design, the active material for each electrode is normally supported within a lead grid structure. In the bipolar electrode design the active material is often adhered to a flat planar surface. The active material adheres much better to a grid-like structure, such as the lead grid in the monopolar electrode design, rather than to a planar structure as in the bipolar electrode design. Various methods have been suggested in the prior art to assist in the adhesion of the active material to the planar bipolar electrode. These methods include attaching a grid to the surface of the bipolar electrode such that the grid is essentially in continuous contact with the surface of bipolar electrode. However, in doing so, the interconnecting crystalline network in the active material is disadvantageously interrupted and weakened by breaking it up into smaller segments.

Although many advances have been made in lead-acid bipolar plate design, the commercial availability of a practical bipolar lead-acid battery has yet to be realized. The development of a bipolar plate to be used for the successful commercialization of bipolar lead-acid batteries suitable for the long sought desire of electric automobiles would be a major technological advance for both the transportation and electric power storage industries.

SUMMARY OF THE INVENTION

One principal object of the present invention is to provide a bipolar plate capable of effective power generation and reliability in a bipolar lead-acid battery.

Another object of the present invention is to provide a lower weight bipolar plate while maintaining the structural characteristics necessary to support the active materials.

Yet another object of the present invention is to provide a bipolar plate having substantial stability to the corrosion potentials encountered during bipolar lead-acid battery operation.

Still another object of the invention is to provide effective active material adhesion to the bipolar plate electrode.

Still a further object of the present invention is to provide a bipolar plate which can be produced using low cost fabrication techniques.

In one broad aspect of the present invention an electrode is provided which comprises a metal-containing, electrically conductive substrate having a first side and an opposing second side; an electrically conductive material secured to the first side; an electrically conductive layer including a polymer secured to the second side; and a metallic layer secured to the electrically conductive layer so that this layer is located between the metallic layer and the metal-containing, electrically conductive substrate. Preferably, the metal-containing, electrically conductive substrate is a sheet having a thickness. The metallic layer preferably comprises lead. The thickness of each of the electrically conductive material, the electrically conductive layer and the metallic layer is preferably less than the thickness of the metal-containing, electrically conductive substrate.

The electrically conductive material is preferably effective in protecting the first side of the substrate from conditions present in the positive side of a lead-acid battery. The electrically conductive layer including a polymer and the metallic layer together are preferably effective in protecting the second side of the substrate from conditions present in the negative side of a lead-acid battery.

The electrically conductive layer including a polymer preferably includes an adhesive and the metallic layer is adhered to this electrically conductive layer including a polymer. Using an electrically conductive adhesive-containing layer in combination with the metal-containing electrically conductive substrate and the metallic layer provides substantial advantages in protecting the substrate from corrosion. For example, pinholes and/or other defects in the metallic layer have a reduced risk of causing corrosion of the substrate. This is so because such pinholes and other defects do not directly lead to the substrate but are maintained separate by the adhesive layer. In addition, during fabrication of the electrode, it is preferred that the metallic layer be applied to the adhesive layer after the adhesive layer has been applied to the substrate. Such application is more preferably accompanied by compression so that the sizes of gaps or air spaces between these three layers are reduced or such gaps or air spaces are even eliminated, which further enhances corrosion resistance.

The electrically conductive layer including a polymer preferably includes carbon, more preferably carbon in a form selected from particles, fibers and the like and mixtures thereof, which provides effective electrical conductivity.

In one very useful embodiment the metal-containing electrically conductive substrate is metal and the electrically conductive material is a layer of material. The metal from which the substrate is formed is preferably selected from titanium, titanium-containing alloys, nickel, nickel-containing alloys and the like and mixtures thereof. The layer of material, in this embodiment, preferably comprises fluorine doped tin oxide.

In another very useful embodiment, the metal-containing electrically conductive substrate is a composite comprising a metal in a polymeric component, and the electrically conductive material comprises a first layer of material and a second layer of material. More preferably, the first layer of material comprises a metal and the second layer of material comprises a polymeric material and an electrically conductive component with the second layer of material being located between the first layer of material and the metal-containing, electrically conductive substrate. The metal in the composite is more preferably present in the form of an expanded mesh. The second layer of material preferably includes an adhesive and the first layer of material is adhered to the second layer of material.

The electrically conductive component preferably comprises acid resistant glass in a form selected from particles, fibers, and the like and mixture thereof. The acid resistent glass has a coating of fluorine doped tin oxide thereon.

In another broad aspect of the present invention, a bipolar plate for a battery, for example, for a lead-acid battery, comprises an electrically conductive electrode element having a first side and an opposing second side; a grid spaced apart from the electrically conductive electrode element in proximity to the first side; positive active material in contact with either the first side or the second side of the electrode element; and negative active material in contact with the first side or the second side which is not in contact with the positive active material. The grid is substantially surrounded by the positive active material or the negative active material and is effective in maintaining the positive active material or the negative active material which substantially surrounds the grid in contact with the electrode element. Having the grid spaced apart from the electrode element provides for increased reinforcement of the active material in contact with the electrode element. This feature provides a very advantageous result of facilitating the maintaining of the material in contact with the electrode element while the bipolar plate is used in battery operation.

In a very useful embodiment, the bipolar plate further comprises a plurality of posts or non-continuous seams which extend outwardly from the electrically conductive electrode element and are effective in maintaining the grid spaced apart from electrically conductive electrode element.

In an additional embodiment, the bipolar plate further comprises an additional grid spaced apart from the electrically conductive electrode element in proximity to the second side. This additional grid is surrounded by the positive active material or the negative active material which does not substantially surround the grid. The additional grid is effective in facilitating the maintaining of the positive active material or the negative active material, as the case may be, which surrounds the additional grid in contact with the electrode element.

Preferably, the grid, and the additional grid if one is present, are positioned substantially parallel to the first and second sides.

Although any suitable bipolar plate electrode element may be employed in the present bipolar plate configuration, it is preferred that the electrically conductive electrode element be as described herein.

The present invention provides a bipolar plate which includes an electrically conductive multilayered electrode (ECME), a frame around the perimeter of the ECME, and one or two grids attached to one or both sides of the ECME. The ECME includes a metal-based, electrically conductive central core sheet or substrate and one or more electrically conductive layers on both sides to protect the central core substrate from corrosion within the lead-acid battery environment. The frame around the perimeter serves to structurally reinforce the ECME and to serve, for example, as a brim, to define the area for the active material. The grids attached to the ECME add structural reinforcement to the active material and aid in securing the active material to the ECME.

In one embodiment of the ECME, the central core substrate is a sheet of metal, preferably titanium. On the side of the sheet designated the positive side, the protective layer preferably includes a thin layer of electrically conductive, fluorine doped tin oxide. On the opposite, negative side of the sheet, a thin sheet of metal, preferably lead, is attached, preferably with a thin layer of electrically conductive adhesive. The electrically conductive adhesive preferably includes carbon, e.g., graphite, particles or fibers dispersed in an adhesive matrix to provide electric conductivity.

In another embodiment of the ECME, the central core substrate or sheet is a polymer/metal composite, preferably composed of an expanded metal mesh, more preferably made of titanium, embedded in a polymer matrix or a polymer/glass composite matrix. On one side of the central core, designated the positive side, a thin sheet of metal, preferably lead, is attached to the central core with a thin layer of acid resistant, electrically conductive adhesive. The acid resistent, electrically conductive adhesive preferably includes acid resistant glass particles or fibers coated with a thin layer of electrically conductive fluorine doped tin oxide that are dispersed in an adhesive matrix. On the opposite, negative side of the central core composite sheet, a thin sheet of metal, preferably lead, is attached to the central core composite substrate with a thin layer of electrically conductive adhesive. The electrically conductive adhesive preferably comprises carbon or graphite particles or fibers dispersed in an adhesive matrix. In this embodiment of the ECME, the central core substrate may be a sheet of metal, preferably titanium.

Within the area defined by the inner perimeter of the frame, grids are attached by a non-continuous seam of polymer-based adhesive such that the body of the grid is raised a distance from the surface, preferably substantially parallel to the surface, of the ECME so that there is a gap exists between the body of the grid and the surface of the ECME. Although the present grid arrangement is particularly effective when used in combination with the ECME of the present invention, such a grid arrangement provides benefits when used in combination with any battery electrode in which active material in contact with an electrode core or protected electrode core is included. When active material is applied to the bipolar plate, the grid is embedded in the active material and the gap between the grid and the ECME is filled with active material. This arrangement has been found to provide reinforcement for the active material and to enhance adhesion to the grid. After the active material is applied, for example, in the form of a paste, to both sides of the bipolar plate and the active material is cured, the pasted bipolar plates are preferably stacked between two endplates aligning positive side with negative side to form a bipolar battery which is very effective in providing reliable power generation.

These and other aspects and advantages of the present invention are apparent in the following description and claims, particularly when considered in conjunction with the accompanying drawings in which like parts bear like reference numerals.

DETAILED DESCRIPTION OF THE INVENTION

Figure 1:
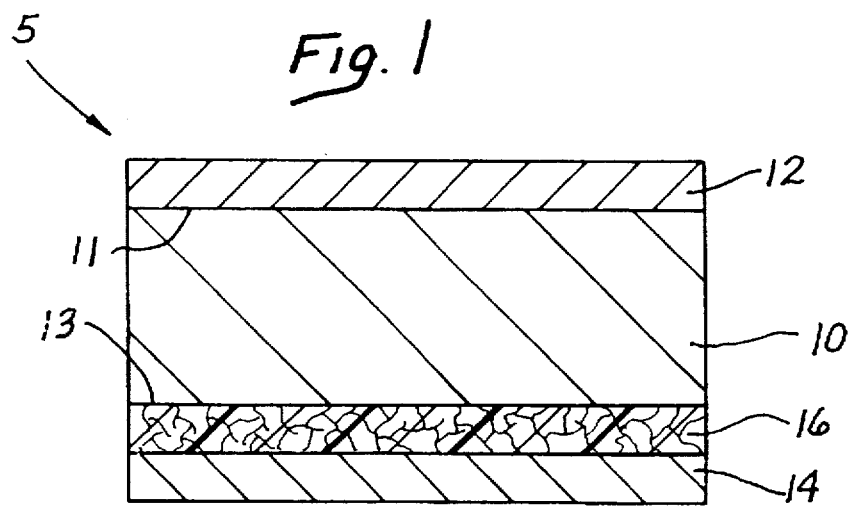
FIG. 1 is a cross-sectional view of an ECME depicting one embodiment of the present invention.

Referring to FIG. 1, an ECME of the present invention, shown generally at 5, includes the central core substrate 10, in the form of a thin impermeable metal, preferably titanium, sheet. Nickel or nickel alloy may also be used. The thickness of the central core metal substrate 10 is preferably in the range of between about 0.5 and about 50 mils. On the side 11 of the metal substrate 10 designated the positive side, a thin protective layer of electrically conductive fluorine doped tin oxide 12 is applied that is resistant to the corrosive potentials on the positive side that are present in a bipolar lead-acid battery. The thickness of the tin oxide layer 12 is preferably between about 0.1 and about 2.5 microns.

The negative side 13 of the central core metal substrate 10 is protected from the corrosive potentials on the negative side that are present in a bipolar lead-acid battery by a thin sheet of metal 14, such as a lead or lead alloy sheet, laminated to the substrate by an intermediate electrically conductive adhesive layer 16. The conductive adhesive layer 16 includes carbon, e.g. graphite, fibers or particles dispersed in a polymer material to provide electrical conductivity. Using this method, sheet 14 can be as thin as between about 0.1 and about 2 mil, and the conductive adhesive layer 16 can be between about 0.1 and about 3 mils thick. Metals other than lead, such as copper and lead coated copper, may be used in layer 14. Some examples of suitable polymer materials for inclusion in layer 16 include, but are not limited to, polyacrylates, polycarbonates, polysulfones and the like.

Titanium is lightweight, resistant to oxidation in 40% w/w sulfuric acid, has good structural characteristics and is a readily available metal making it an ideal material for the central core substrate 10 of the ECME 5. During battery operation, if left unprotected, a titanium central core substrate will develop a non-uniform layer of non-conducting corrosion deposits on the positive side. Not only will these deposits increase the resistance of the bipolar plate, but will lead to poor PAM utilization and loss of contact with the PAM.

The layer of fluorine doped tin oxide 12 protects against this type of corrosion. Layer 12 may be applied using any suitable technology or combination of technologies. Preferably, layer 12 is applied by spray pyrolysis to the central core substrate 10 at temperatures greater than about 400° C. Dopants for tin oxide films other than fluorine, notably antimony, have been found to be chemically unstable to the potentials on the positive side. Because of the high temperatures involved in the spray pyrolysis process, the central core substrate 10 should have a sufficiently high melting point and the surface should not be easily oxidized by the spray pyrolysis process. The tin oxide coating also preferably forms a wetable surface which facilitates bonding the PAM to the ECME.

During lead-acid battery operation, the negative side of the central core substrate 10 experiences potentials that, if left unprotected, can cause the titanium to become chemically unstable resulting in perforation of the substrate, thus, shorting of the adjacent cells of the battery. In contrast, on the positive side of the ECME 5, pinholes or defects in the coating 12 would only result in a non-conductive corrosion deposit on the substrate 10 at the pinhole or defect and not to perforation of the substrate. Thus, it has been critically important that the negative side protective coatings be free of pinholes or defects so as not to expose the core substrate 10 to corrosive potentials. The ideal protective layer for the negative side is lead or lead alloy. Lead is thermodynamically stable to the potentials at the negative electrode and provides a good surface for bonding to the NAM. Lead films can be deposited by a number of methods such as hot dipping, electroplating, physical vapor deposition, sputtering, arc flame spraying, cladding and the like. However, in the prior art, the protective films have had to be thick enough to be free of pinholes or defects in the coating, thus disadvantageously adding substantial weight to the bipolar plate.

In the present invention, the core substrate 10 is protected from defects in the protective lead layer by using an electrically conductive adhesive layer 16 containing a carbon, e.g., graphite, filler. Both the adhesive portion and the filler portion of adhesive layer 16 are thermodynamically stable to the corrosive potentials on the negative side in a bipolar lead-acid battery. The conductive adhesive layer 16 is applied to either the lead or titanium surface and the two sheets are pressed together under pressure, and heat if necessary. As the two sheets are pressed together, the conductive adhesive layer 16 fills any pinholes or defects in the lead sheet 14. Further pressing on the two sheets during the lamination process compresses the voids or channels in the conductive adhesive layer 16, reducing porosity and providing an electrolyte impervious barrier.

Since only a thin layer 16 of the electrically conductive adhesive is used, the loading of the electrically conductive filler can be minimized and yet satisfactory electrical conductivity is produced. Less filler in the conductive adhesive layer 16 reduces the amount of voids and channels formed during the lamination process. Laminating the metal sheet 14 to the central core substrate 10 can be used as a low cost manufacturing technique by feeding the titanium substrate, lead foil and intermediate conductive adhesive layer through a pair of pinch rollers. The conductive adhesive layer 16 may also be in the form of a separate pressure sensitive adhesive film. It is preferred to apply the tin oxide layer 12 before lamination of the negative side layer 14 due to the high temperatures which are employed in the preferred spray pyrolysis process.

Figure 2:
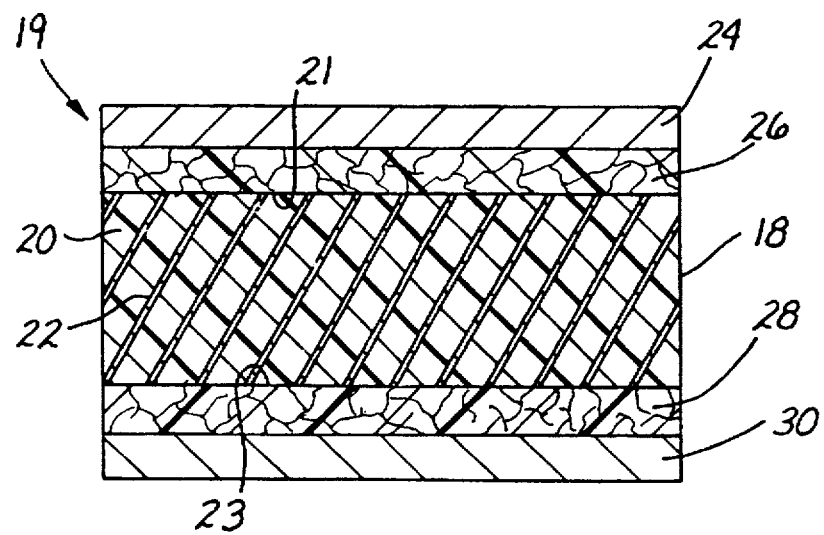
FIG. 2 is a cross-sectional view of an ECME depicting an alternate embodiment of the present invention.

In another embodiment, an ECME, shown as 19 in FIG. 2, includes a polymer/metal mesh composite core 18 of a polymeric sheet 20 in which is embedded an expanded metal mesh 22. The expanded metal mesh 22 extends to both surfaces 21 and 23 of the core 18. The thickness of the core 18 is preferably between about 0.5 and about 50 mils. The expanded metal mesh 22 is preferably made of titanium, although other metals, such as lead, nickel, tin, aluminum, iron, copper and the like and mixtures thereof, may be used. In place of an expanded metal mesh 22, a woven or unwoven metal wire mesh or metal wire screen may be used. Some examples of suitable classes of polymer materials from which the polymeric sheet 20 in the central core 18 can be made include, but are not limited to, olefinic polymers, acrylic polymers, polycarbonates, polysulfones and the like. Additional filler may be blended into the polymer of the polymeric sheet 20 in the form of acid resistant glass particles or fibers adding extra strength to the core 18.

The surface of each side 21 and 23 of the central core 18 is protected by laminating a sheet of metal, such as lead or a lead alloy, using a conductive adhesive, similar to the process described on the negative side of the previously described embodiment.

A thin sheet of metal 24, such as lead or a lead alloy, is laminated to the side designated positive using an electrically conductive adhesive layer 26 containing acid resistant glass particles or fibers coated with fluorine doped tin oxide dispersed in a polymer adhesive material. The thickness of the fluorine doped tin oxide coating on the glass substrate is between about 0.1 and about 2.5 microns. Using this method, lead or lead alloy foils as thin as between about 0.1 and about 2 mil may be laminated and the conductive adhesive layer is preferably between about 0.1 and about 3 mils thick. Metals other than lead may be used as a positive side protective metal layer 24 such as, for example, tin. Examples of polymers for inclusion in layer 26 include, but are not limited to, phenolic polymers, acrylic polymers, polycarbonates, polysulfones and the like.

The side 23 designated the negative side of the central core plastic/metal mesh substrate 18 is protected by using a carbon, e.g., graphite, filled electrically conductive adhesive 28 to laminate a sheet of metal 30, preferably lead or lead alloy, to the negative side of the substrate. The specifications of the negative side protective layers are similar to that of the embodiment of FIG. 1, discussed previously.

The combination of a metal mesh in a polymeric sheet as in core 18 offers the advantages of the electrical conductivity of a metal sheet and the reduced weight of a polymeric composite. The substrate 18 can be fabricated by impregnating an expanded metal mesh with a polymer and then forming this product into a planar sheet under heat and pressure. The polymer may either be a thermoset or a thermoplastic resin. In the case of a thermoset composite, the metal mesh 22 may easily be impregnated by dipping into the uncured polymer precursor and then partially curing before pressing into the final shape. For a thermoplastic composite, the metal mesh 22 may be impregnated in the polymer by a variety of techniques, such as, for example, solvent impregnation, powder spraying or by melting the polymer into the mesh interstices. After pressing, the substrate 18 is then abraded to remove any mold release and to expose the metal mesh to the surface of the substrate to insure electrical contact with the subsequent conductive protective layers.

A metal sheet may be substituted for the central core polymer/metal mesh composite substrate 18. Since in this embodiment the substrate 18 does not have to withstand the high temperatures and corrosive conditions of the tin oxide spray pyrolysis process, lower melting metals other than titanium and nickel may be used.

In the case where the substrate 18 is the polymer metal mesh composite, it is not preferred to apply a protective layer of fluorine doped tin oxide to the positive side due to the high temperatures involved in the spray pyrolysis process. The lead sheet 24 on the positive side not only provides a good surface to make an electrical bond with the PAM but it also serves as a cover sheet to compress the conductive adhesive layer 26 during the lamination process, reducing voids or channels in the conductive adhesive layer, thereby forming an electrolyte impervious protective layer. With further regard to the electrically conductive adhesive layer 26, both the adhesive portion and the tin oxide coated glass portion are thermodynamically stable to the corrosive potentials on the positive side. However, the lead sheet 24 on the positive side 21 eventually corrodes during battery operation. Once the lead sheet 24 corrodes, the metal mesh 22 in the substrate 18 is still protected from the corrosive potentials on the positive side by the conductive adhesive layer 26.

Figure 3:
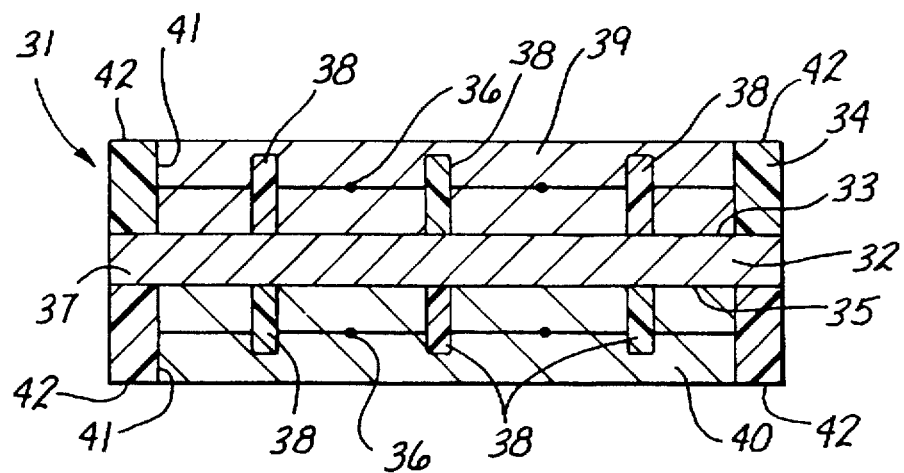
FIG. 3 is a cross sectional view of a bipolar plate of the present invention.
Figure 4:
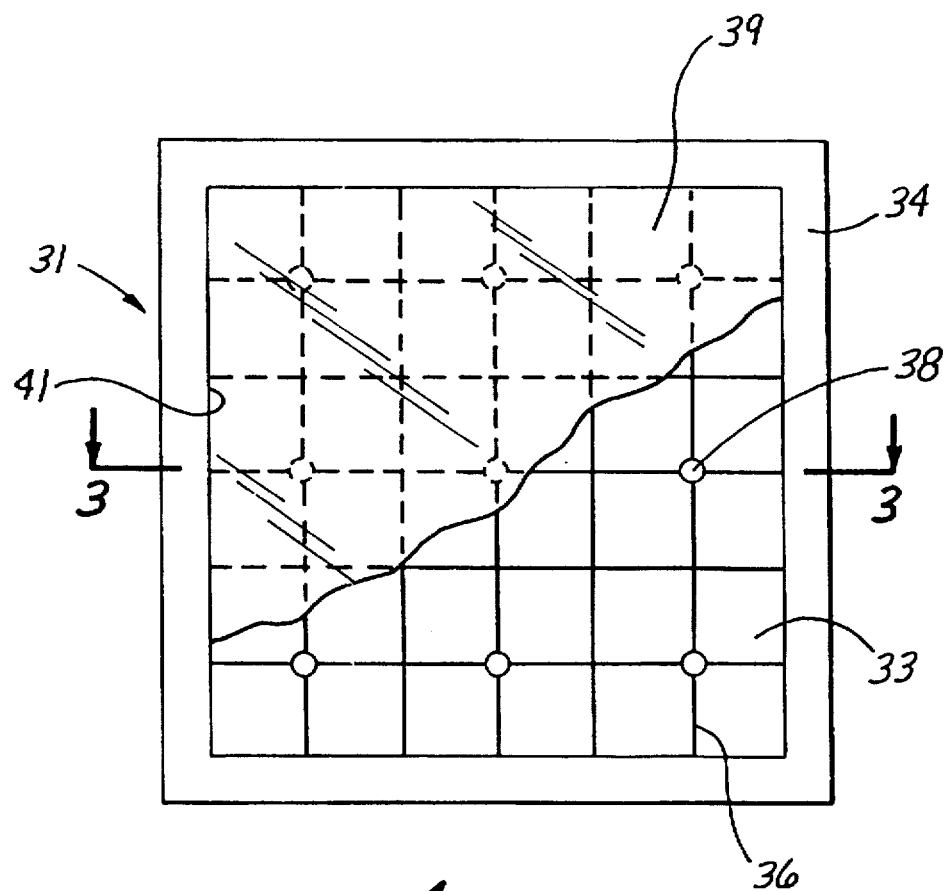
FIG. 4 is a top view of the bipolar plate shown in FIG. 3 with a portion of the positive active material removed for illustrative clarity.

FIGS. 3 and 4 illustrate a bipolar plate structure 31 of the present invention. Structure 31 includes an ECME 32, which can be configured as shown in FIGS. 1 or 2. A frame element 34 is attached to both surfaces 33 and 35, at the perimeter 37 of the ECME 32. Grids 36 are attached to both surfaces 33 and 35 of the ECME 32 by a non-continuous seam, or a plurality of posts, 38 of corrosion resistant adhesive. The diameters of the strands composing the grid 36 are less than the thickness of the positive active material 39 and the negative active material 40, preferably about 25% to about 90% less. The grid or mesh 36 is attached in such a way that a portion of the grid is positioned parallel to and spaced apart from the surface of the ECME 32 such that the grid is embedded within the thickness of the positive active material 39 and the negative active material 40. The frame 34, grids 36 and non-continuous seam of adhesive 38 need to be resistant to the acidic and corrosive environment within the bipolar lead-acid battery. Suitable materials for these elements include polymers, such as olefinic polymers, phenolic polymers, acrylic polymers, polycarbonates, polysulfones and the like. The combination of the frame 34, grids 36 and ECME 32 completes the structure of a bipolar plate for use in a bipolar lead-acid battery.

The frame 34 around the perimeter of the ECME 32 in all of the embodiments forms a berm 41 which defines the active area containing the positive active material 39 and the negative active material 40. It also provides for structural support and serves as a surface to bond to other bipolar plates. The perimeter of frame 34 may be attached to the ECME 32 by, for example, a non-conductive corrosion resistant adhesive, ultrasonic welding or other welding techniques. The frame 34 may extend out beyond the ECME 32 in which case it may either be injection or compression molded.

By positioning the grid 36 spaced apart from the surface of the ECME 32 and in the body of the positive active material 39 and the negative active material 40, the grid 36 acts to reinforce the active materials in much the same manner attaching a supporting steel grid slightly away from a surface when applying concrete stucco or plaster to that surface. If the grid 36 is a polymeric grid it can be conditioned before attachment to the surface of the ECME 32 to increase adhesion of active material to the grid by etching techniques such as bead blasting, or plasma etching.

Conventional active materials can be applied, for example, as a paste, to the height of the frame 34 to both the positive and negative sides and then cured by standard or conventional methods. The pasted and cured bipolar plates can then be stacked between two endplates with the positive side of each bipolar plate facing the negative side of the adjacent bipolar plate. The endplates include a sheet-like monopolar electrode facing the adjacent bipolar electrode of opposite polarity and a collector for collecting the current. Glass separators may be placed between the pasted and cured bipolar plates and the endplates. The surfaces 42 of frame 34 of the bipolar plates in the stack may be sealed to adjacent bipolar plates by a variety of methods, such as adhesive bonding, plastic welding or an elastomeric gasket. The thickness of the seal element forms a cavity defining each cell to hold the sulfuric acid electrolyte. Sulfuric acid electrolyte is introduced into each cell and the battery is then ready for operation.

The following non-limiting examples illustrate certain aspects of the present invention.

EXAMPLE 1

The following example shows a bipolar plate based on the embodiments illustrated in FIGS. 1, 3 and 4 and a 4 volt bipolar battery fabricated thereof. The 4 volt bipolar battery includes the bipolar plate placed between two endplates made from lead sheets.

The central core substrate of the bipolar plate was based on a thin sheet of titanium. The dimensions of the titanium sheet were 6.75 inches ×6.75 inches ×0.01 inch. The titanium sheet was heated to 600° C. and sprayed with an aqueous solution of stannic chloride and ammonium fluoride to deposit the layer of fluorine doped tin oxide on the positive side of the substrate. The opposite, negative side of the titanium sheet was protected from oxidation during the tin oxide coating process by a blanket of argon. A one (1) mil thick coating of a graphite filled acrylic polymer based conductive adhesive was then sprayed onto the negative side of the titanium sheet at room temperature. A two (2) mil thick lead sheet was then pressed onto the conductive adhesive at 200° C. and 500 psi. Prior to lamination, the lead sheet was lightly abraded with steel wool on the side to be laminated to improve adhesion. Frames of outer dimensions 6.75 inches ×6.75 inches and inner dimensions of 5.00 inches ×5.00 inches, made of 30 mil acrylic polymer sheet were pressed onto both sides of the electrically conductive multilayered electrode with approximately a three (3) mil thick layer of a hot melt glue to form a berm to hold the active material. Polyethylene grids of dimensions 5.00 inches ×5.00 inches with 0.020 inch diameter strands spaced 0.45 inch apart were attached at various spots to the surface of both the positive and negative sides of the electrode. The grids were attached to both sides with hot melt glue in such a way as to keep about a 0.005 inch to 0.010 inch gap between the surface of the electrode and the grids.

Active material was applied to both sides of bipolar plate to the thickness of the frame and to the endplates in the form of a lead oxide paste and cured at 95° F. in water saturated air. The density of the PAM paste was 69 g/in$^3$ and the density of the NAM paste was 71 g/in$^3$. The bipolar battery was assembled by stacking the bipolar plate between the two endplates. Glass separators were placed between the bipolar plate and endplates. The bipolar plate was sealed with rubber gaskets around the perimeter surface of the frame. The bipolar battery was then filled with 40% w/w sulfuric acid.

After formation, the battery was discharged to 3.7 volts, delivering 3.07 Amp-hr. in 3.4 hr. corresponding to approximately 50% of the theoretical utilization. The bipolar battery delivered 85 charge/discharge cycles to 75% depth of charge over a 2 year period. In each case the open circuit voltage remained at 4.2 V after recharge, indicating that the bipolar plate was not permeated by corrosion.

After 78 charge/discharge cycles, an analysis for dissolved titanium in the electrolyte was performed by inductively coupled plasma mass spectrometry (ICPMS). Both cells showed less than 1 ppm of dissolved titanium in the electrolyte demonstrating the effectiveness of the corrosion protective layers on the titanium substrate. These results demonstrate the utility of using the fabricated bipolar plate with corrosion resistant properties in a bipolar lead-acid battery for extended charge/discharge cycle life.

EXAMPLE 2

An electrically conductive multilayered planar electrode was constructed which employs a regular expanded lead mesh as the conductive portion of the central core substrate. The expanded lead mesh has raised strands and bonds set at a uniform angle to the plane of the sheet. The openings in the expanded lead mesh were 0.10 inch wide by 0.12 inch in length. A sheet of polycarbonate was allowed to melt into the mesh at 265° C. and then pressed into a planar sheet at 105° C. and 200 psi. The surface of the core metal mesh composite substrate was then abraded with sandpaper to expose the raised strands of the embedded expanded lead mesh. A three (3) mil thick layer of a conductive adhesive was spread onto the side of the substrate designated the positive side. The electrically conductive acrylic polymer adhesive contained 13 micron diameter acid resistant glass fibers coated with approximately 1 micron of conductive fluorine doped tin oxide coating. The fibers were crushed into approximately 15 to 50 micron lengths before being dispersed into the acrylic polymer adhesive. A two (2) mil thick lead sheet was then pressed onto the conductive adhesive at room temperature and 500 psi. Prior to lamination, the lead sheet was lightly abraded with steel wool on the side to be laminated to improve adhesion. A one (1) mil thick coating of a graphite filled acrylic polymer based conductive adhesive was then sprayed onto the opposite, negative side of the composite substrate. A two (2) mil thick lead sheet was then pressed onto the conductive adhesive at 100° C. and 500 psi. As on the positive side, the lead sheet for negative side was lightly abraded with steel wool on the side to be laminated to improve adhesion.

The weight of the multilayered planer electrode was 1.63 g/in$^2$ and the resistivity was found to be 0.40 ohm-cm. This example demonstrates the viability of using a metal mesh composite as the substrate for a multilayered planar electrode in a bipolar battery plate.

While the foregoing description and examples illustrate various specific embodiments, it is to be understood that the invention is not limited thereto, that the scope of the invention should be solely defined by the following claims.

What is claimed is:

1. A bipolar plate for a battery comprising:

an electrically conductive electrode element having a first side and an opposing second side;

a grid attached to and spaced apart from said electrically conductive electrode element in proximity to said first side;

positive active material in contact with first side or said second side; and negative active material in contact with said first side or said second side not in contact with said positive active material, said grid being substantially surrounded by said positive active material or said negative active material and being effective in facilitating the maintaining said positive active material or said negative active material which substantially surrounds said grid in contact with said electrically conductive electrode element.

2. The bipolar plate of claim 1 which further comprises a plurality of posts which extend outwardly from said electrically conductive electrode element and are effective in maintaining said grid spaced apart from said electrically conductive electrode element.

3. The bipolar plate of claim 1 which further comprises an additional grid spaced apart from said electrically conductive electrode element in proximity to said second side, said additional grid being surrounded by said positive active material or said negative active material not substantially surrounding said grid, said additional grid being effective in facilitating the maintaining of said positive active material or said negative active material which substantially surrounds said additional grid in contact with said electrically conductive electrode element.

4. The bipolar plate of claim 1 wherein said grid is positioned substantially parallel to said first side.

5. The bipolar plate of claim 1 wherein said electrically conductive electrode element comprises:

a metal-containing, electrically conductive substrate having two opposing sides;

an electrically conductive material secured to one of said opposing sides;

an electrically conductive layer including a polymer secured to the other of said opposing sides; and a metallic layer secured to said electrically conductive layer so that said electrically conductive layer is located between said metallic layer and said metal-containing electrically conductive substrate.

6. The bipolar plate of claim 5 wherein said metal-containing, electrically conductive substrate is metal and said electrically conductive material is a layer of fluorine doped tin oxide.

7. The bipolar plate of claim 5 wherein said metal-containing, electrically conductive substrate is a composite comprising a metal and a polymeric component, and said electrically conductive material comprises a first layer of a metal and a second layer of a polymeric material and an electrically conductive component.

* * * * *